United States Patent
Cui et al.

(10) Patent No.: US 12,083,715 B2
(45) Date of Patent: Sep. 10, 2024

(54) MOLD COMPOUND DISPENSING SYSTEM AND METHOD

(71) Applicant: Western Digital Technologies, Inc., San Jose, CA (US)

(72) Inventors: Xianlu Cui, Shanghai (CN); Junrong Yan, Shanghai (CN); C K Chin, Shanghai (CN); Tao Shi, Shanghai (CN)

(73) Assignee: Morgan, Lewis & Bockius LLP, San Jose, CA (US)

( * ) Notice: Subject to any disclaimer, the term of this patent is extended or adjusted under 35 U.S.C. 154(b) by 344 days.

(21) Appl. No.: 17/540,371

(22) Filed: Dec. 2, 2021

(65) Prior Publication Data

US 2023/0173720 A1    Jun. 8, 2023

(51) Int. Cl.

| | |
|---|---|
| *B29C 43/58* | (2006.01) |
| *B29C 41/18* | (2006.01) |
| *B29C 43/18* | (2006.01) |
| *G05B 19/4097* | (2006.01) |
| *H01L 21/56* | (2006.01) |
| *B29K 63/00* | (2006.01) |
| *B29L 31/34* | (2006.01) |
| *H01L 25/065* | (2023.01) |
| *H01L 25/18* | (2023.01) |

(52) U.S. Cl.
CPC .............. *B29C 43/58* (2013.01); *B29C 43/18* (2013.01); *G05B 19/4097* (2013.01); *H01L 21/561* (2013.01); *B29C 2043/182* (2013.01); *B29C 2043/5825* (2013.01); *B29K 2063/00* (2013.01); *B29L 2031/34* (2013.01); *G05B 2219/45031* (2013.01); *H01L 25/0657* (2013.01); *H01L 25/18* (2013.01); *H01L 2225/06506* (2013.01); *H01L 2225/0651* (2013.01); *H01L 2225/06562* (2013.01); *H01L 2225/06586* (2013.01)

(58) Field of Classification Search
CPC ... B29C 43/58; B29C 43/18; B29C 2043/182; B29C 2043/5825; B29C 43/34; G05B 19/4097; G05B 2219/45031; H01L 21/561; H01L 25/0657; H01L 25/18; H01L 2225/06506; H01L 2225/0651; H01L 2225/06562; H01L 2225/06586; H01L 23/3128; H01L 21/565; H01L 21/566; B29K 2063/00; B29L 2031/34
See application file for complete search history.

(56) References Cited

U.S. PATENT DOCUMENTS

2006/0093692 A1*   5/2006   Miyajima ............... B29C 43/58
                                                                                                         425/141
2008/0164618 A1*   7/2008   Chow ................. H01L 23/3121
                                                                                                         438/126

* cited by examiner

*Primary Examiner* — Charles R Kasenge
(74) *Attorney, Agent, or Firm* — Morgan, Lewis & Bockius LLP

(57) ABSTRACT

A molding compound dispensing system identifies a semiconductor device strip having a substrate with a plurality of segments allocated for die stacks. The system obtains topological data of the identified semiconductor device strip for each of the segments, including data indicative of any semiconductor components in each respective segment. The system determines an amount of molding compound to be applied to each of the segments based on the topological data for each respective segment, and causes a molding compound dispenser to dispense the determined amounts of molding compound at each of the segments.

20 Claims, 13 Drawing Sheets

MOLD COMPOUND DISPENSING SYSTEM AND METHOD

BACKGROUND

A semiconductor device package may include a plurality of semiconductor dies and a controller packaged together on a substrate and encapsulated in a molding compound. The dies may be disposed in one or more adjacent stacks, with the dies in each stack being electrically coupled to the substrate with respective pluralities of bonding wires. The substrate includes communication lines that route electrical signals between the bonding wires and the controller and to external connections.

During manufacturing, some encapsulation processes may apply the molding compound to one area of the substrate and transfer the molding compound to the rest of the substrate in a flow path. The flow path directs the molding compound over the dies and bonding wires, sometimes causing the bonding wires to break or deform (referred to as wire sweep) or leaving voids in the package due to incomplete fills.

Other encapsulation processes may apply the molding compound to the entire substrate in a uniform manner and compress the molding compound and the substrate. During this compression process, however, the molding compound may flow from segments of the substrate that are populated with dies to segments of the substrate that are not populated with dies. Such unbalanced mold flow can cause wire sweep or leave voids in the package.

As semiconductor device packages become more complex and bonding wires become longer, the flow of molding compound during the encapsulation process increases the risk of damage to the internal components of the semiconductor device package, thereby lowering yields and raising manufacturing costs.

SUMMARY

The present disclosure describes an encapsulation system and method for applying molding compound to the substrate of a strip of semiconductor device packages in a non-uniform manner, resulting in the reduction of unbalanced mold flow, thereby decreasing the risk of damage to the internal components of the semiconductor device package while the molding compound is being applied.

In one aspect, a method of controlling a molding compound dispenser identifying, using an electronic input device such as a scanner, a semiconductor device strip comprising a substrate having a plurality of segments allocated for die stacks. The method further includes obtaining, from a database, topological data of the identified semiconductor device strip, wherein the topological data indicates whether each of the plurality of segments is populated with a die stack or is not populated with a die stack. The method further includes determining an amount of molding compound to be applied to each of the plurality of segments based on the topological data, wherein an amount of molding compound to be applied to a segment that is not populated with a die stack is greater than an amount of molding compound to be applied to a segment that is populated with a die stack. The method further includes causing a molding compound dispenser to dispense the determined amounts of molding compound on a plurality of segments of a release film, wherein each of the plurality of segments of the release film corresponds to one of the plurality of segments of the substrate. The method further includes operating a compression molding device to apply the dispensed amounts of molding compound to corresponding segments of the plurality of segments of the substrate.

BRIEF DESCRIPTION OF THE DRAWINGS

The foregoing summary, as well as the following detailed description, will be better understood when read in conjunction with the appended drawings. For the purpose of illustrating the present disclosure, there are shown in the drawings embodiments which are presently preferred, wherein like reference numerals indicate like elements throughout. It should be noted, however, that aspects of the present disclosure can be embodied in different forms and thus should not be construed as being limited to the illustrated embodiments set forth herein. The elements illustrated in the accompanying drawings are not necessarily drawn to scale, but rather, may have been exaggerated to highlight the important features of the subject matter therein. Furthermore, the drawings may have been simplified by omitting elements that are not necessarily needed for the understanding of the disclosed embodiments.

DETAILED DESCRIPTION

The present subject matter will now be described more fully hereinafter with reference to the accompanying Figures, in which representative embodiments are shown. The present subject matter can, however, be embodied in different forms and should not be construed as limited to the embodiments set forth herein. Rather, these embodiments are provided to describe and enable one of skill in the art.

Figure 1:
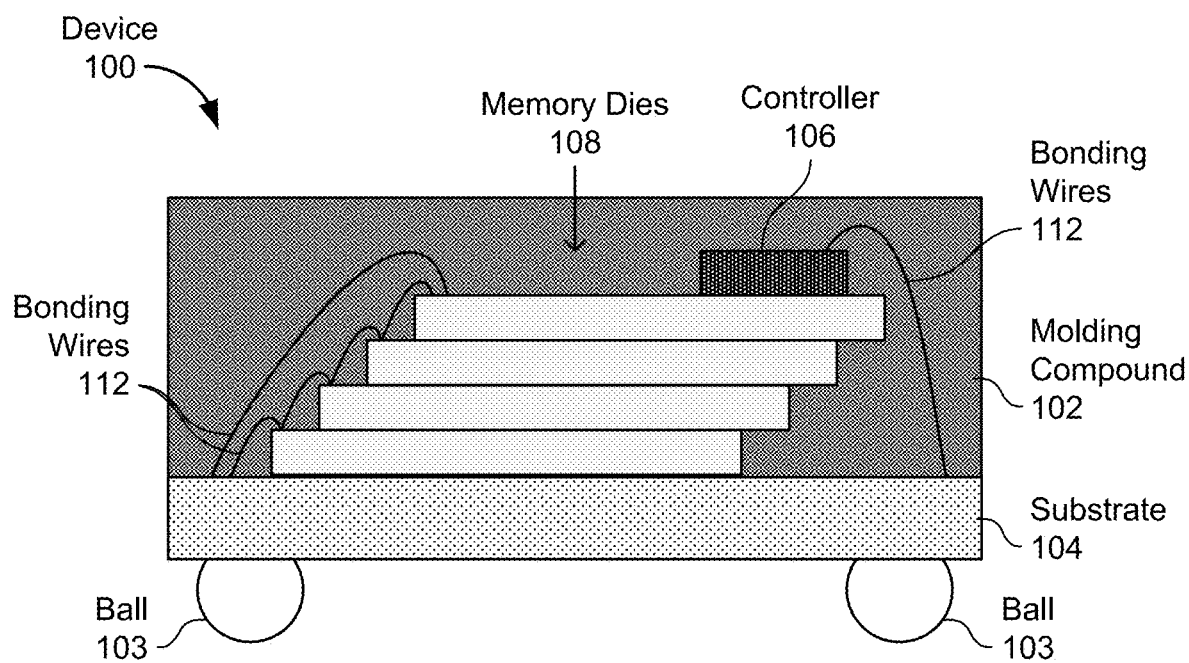
FIG. 1 is a cross-sectional side view of a portion of a semiconductor device package including a substrate, a controller, and a stack of dies.
Figure 1:
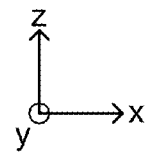

FIG. 1 is a cross-sectional side view of a portion of a stacked die semiconductor device 100 including a substrate 104, a controller 106, and a stack of semiconductor dies 108, all encapsulated in a molding compound 102. Molding compound 102 may include, for example, an epoxy molding compound (EMC) or other encapsulant material known in the art. Molding compound 102 may be a granular powder, and is sometimes referred to as a powder compound. As used herein, the term "encapsulation" refers to the process of sealing a semiconductor device with molding compound, thereby protecting internal components (e.g., processors, dies, and bonding wires) from breakage.

Device 100 may be any type of semiconductor device, such as a system-in-package (SiP). In one nonlimiting example, device 100 is a storage device (e.g., a secure digital (SD) card or a MultiMediaCard (MMC)) and the dies 108 are Not AND (NAND) dies.

Substrate 104 is both a mechanical base support of device 100 and an electrical interface that provides access to the dies 108 housed within the package. The electrical interface includes a plurality of metal layers within the substrate, including at least one layer for routing data using conductive (e.g., copper) traces, a ground layer, and/or a power layer. The plurality of metal layers include at least (i) a top layer in electrical contact with bonding wires 112 and upon which other elements may be mounted, and (ii) a bottom layer in electrical contact with solder balls 103, through which signals are routed between dies 108 and circuit elements outside device 100.

Controller 106 may be an application-specific integrated circuit (ASIC), or any other type of controller. Controller 106 is electrically coupled to the top layer of substrate 104 using bonding wires 112. In some implementations, controller 106 may be mounted using flip chip mounting.

Semiconductor dies 108 may be integrated circuits configured for data storage (sometimes referred to as memory dies). In some implementations, dies 108 are NAND flash dies, each comprising a plurality of NAND memory cells. In other implementations, dies 108 may each comprise a plurality of other types of memory cells, such as Not OR (NOR) memory cells.

In some implementations, device 100 may include more than one stack of dies, more than four dies in each stack, fewer than four dies in each stack, or different numbers of dies in each stack. By adding more dies to the package, the storage capacity of device 100 is increased. However, this increased storage capacity comes at a cost of added complexity, including higher stack height, longer bonding wires, and more complicated internal routing. With this added complexity, longer bonding wires are more susceptible to wire sweep during encapsulation. As such, the importance of minimizing mold flow during encapsulation increases as devices 100 become more complex.

In some implementations, device 100 is manufactured as part of a strip of devices 100, referred to herein as a semiconductor device strip. Manufacturing a plurality of semiconductor devices in a single strip, and then separating the devices into separate packages, allows the manufacturing process to take advantage of efficiencies that would not be possible if each individual package were separately manufactured. For instance, an entire strip of semiconductor devices may be encapsulated in one operation, which saves time and money compared to a process that encapsulates only one package at a time. However, when encapsulating a strip that is not uniformly populated with dies or die stacks, unbalanced mold flow may occur between portions of the strip that are populated and portions of the strip that are not populated. Even in scenarios in which a strip is uniformly populated, unbalanced mold flow may still occur at certain portions of the strip, such as the edges. The discussion below describes encapsulation operations in more detail, as well as techniques for minimizing the aforementioned instances of mold flow.

Figure 2:
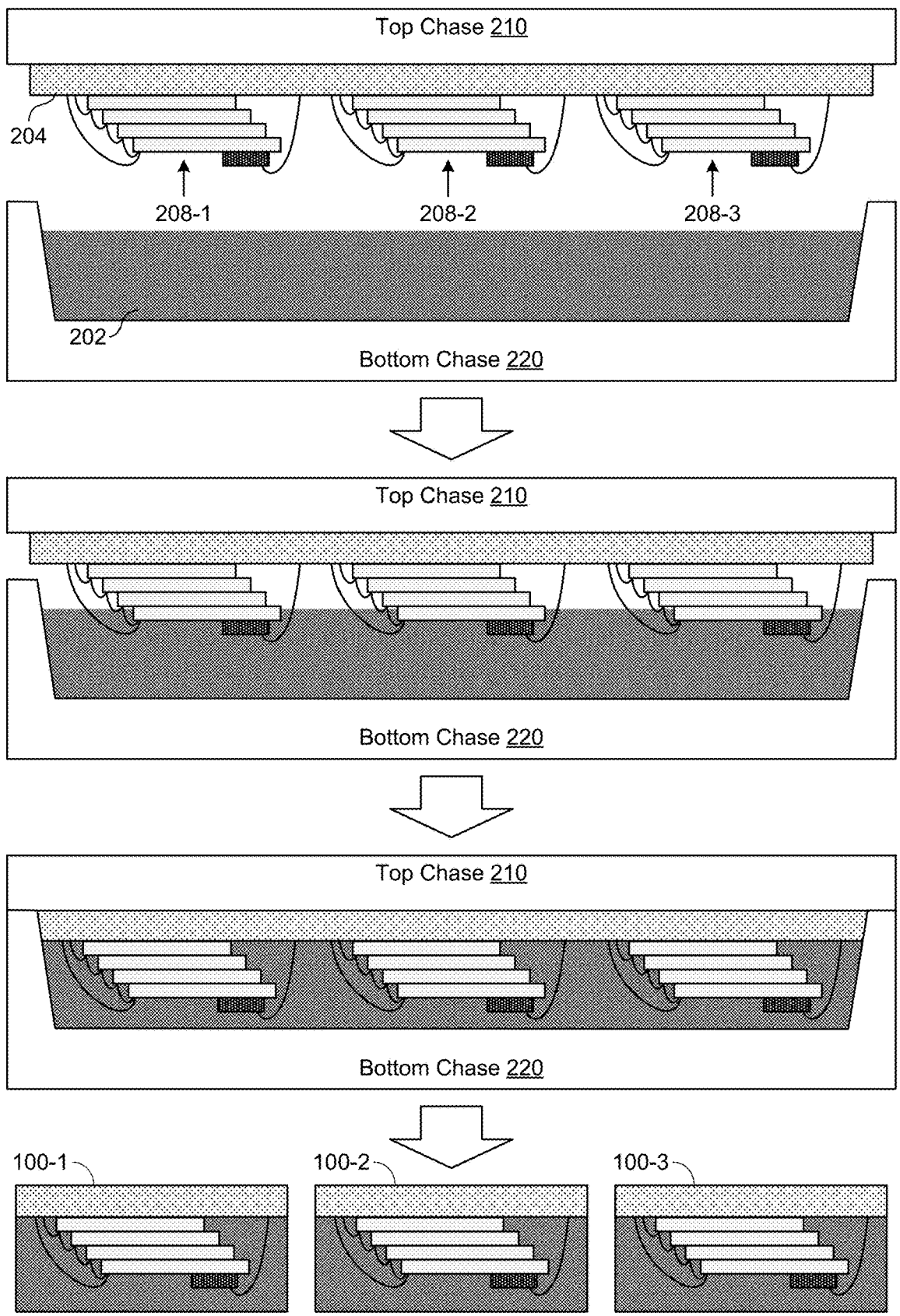
FIG. 2 is a cross-sectional side view of a series of operations for encapsulating a fully populated semiconductor device strip using a uniform dispensing process.

FIG. 2 is a cross-sectional side view of a series of operations for encapsulating a fully populated semiconductor device strip. Here, an example semiconductor device strip includes three die stacks 208 electrically and physically coupled to a single substrate 204. A compression mold device including a top chase 210 and a bottom chase 220 may be used to encapsulate the semiconductor device strip in molding compound 202.

The semiconductor device strip is mounted, upside down, to top chase 210, and the molding compound 202 is dispensed on a release film and placed on bottom chase 220. With the semiconductor device strip and molding compound placed in the compression mold device, top chase 210 and bottom chase 220 are clamped together, the molding compound is heated, and the two chases are brought together, thereby compressing the molding compound onto the semiconductor device strip. Once the molding compound 202 cures, the two chases are opened, the semiconductor device strip (including the molding compound) is removed from the top chase 210 of the compression mold device, and the semiconductor device strip is separated into individual devices 100.

Figure 3A:
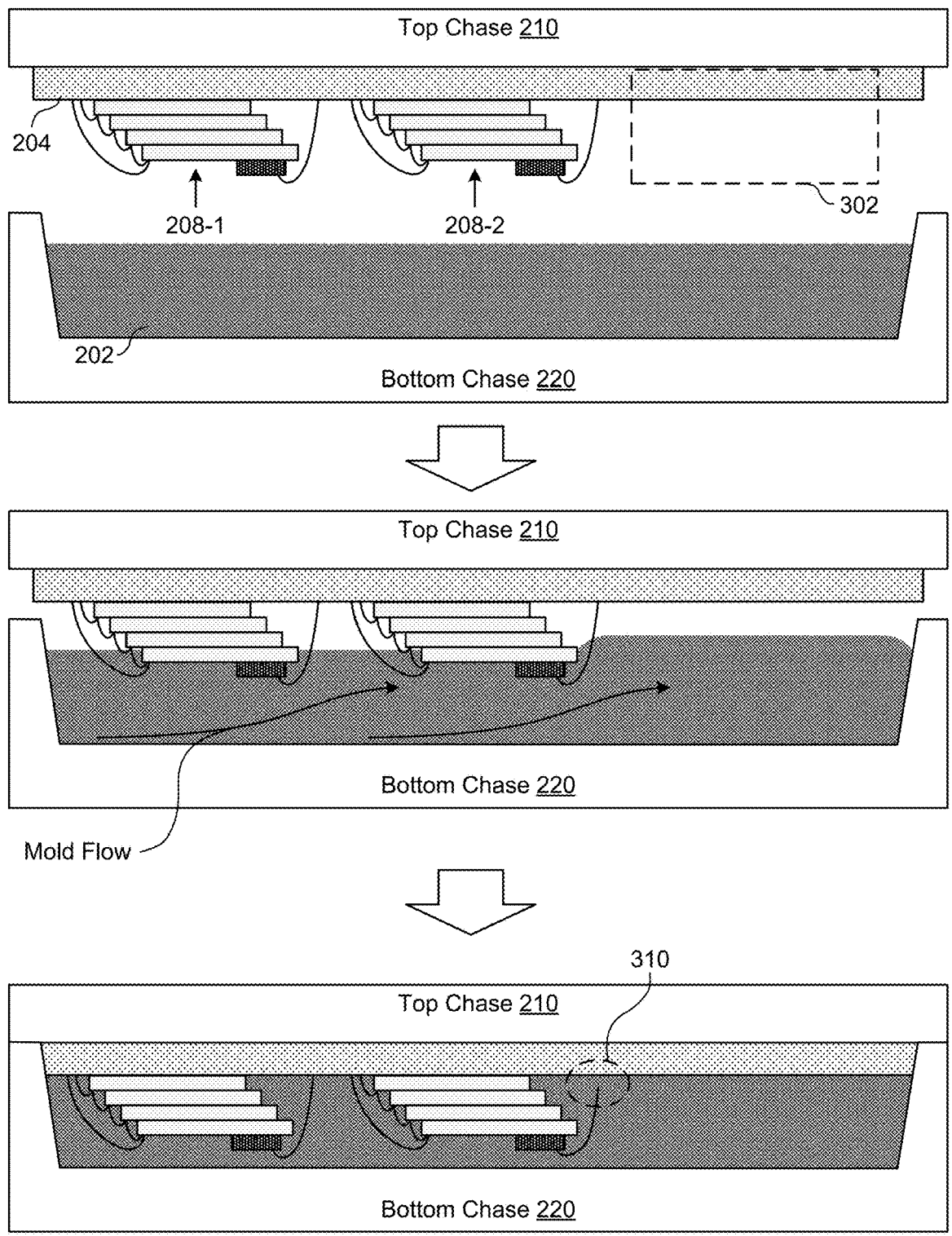
FIGS. 3A-3B include respective cross-sectional side views of a series of operations for encapsulating a partially populated semiconductor device strip using a uniform dispensing process and a non-uniform dispensing process, respectively.

FIG. 3A is a cross-sectional side views of a series of operations for encapsulating a partially populated semiconductor device strip using a uniform dispensing process as described above with reference to FIG. 2. An example semiconductor strip includes a single substrate 204 with three positions (also referred to as segments or units) configured for coupling to three die stacks 208. Each position corresponds to a device 100 (as described with reference to FIG. 1). However, one of the positions 302 is not populated with a die stack. This may be due to the substrate for that position having not passed a quality test in a previous manufacturing step (referred to as a substrate reject). Such a position is referred to as an X-out. Rather than scrap the whole semiconductor device strip if there are a few failed substrate segments, the semiconductor device strip may proceed through manufacturing with the failed substrate segments marked as X-outs.

Alternatively, position 302 may be populated with a die stack, but the die stack may be shorter than the other die stacks 208-1 and 208-2. In such a scenario, such a stack may include fewer dies by design, or may include fewer dies due to an error or a failed test in a previous manufacturing step. For instance, if one die in a particular die stack does not pass a quality test, that particular die stack may be designated as an X-out or otherwise discarded from the final batch of semiconductor device packages. Subsequent manufacturing steps for applying additional dies to die stacks in the semiconductor device strip may skip that particular die stack, so as to not waste dies.

Alternatively, position 302 may be designated as a no-die position. In such a scenario, a semiconductor device strip may have more positions than necessary for a particular batch of semiconductor device packages, so the extra positions are not populated by design (rather than not being populated due to failed units as described above).

Regardless of the scenario, position 302 has a vertical displacement from substrate 204 that is smaller than the vertical displacement of the other positions (those corresponding to die stacks 208-1 and 208-2). If the molding compound 202 is uniformly applied and placed in bottom chase 220, the difference in vertical displacements between the positions of the semiconductor device strip causes molding compound to flow in the direction of the smaller vertical displacements while top chase 210 and bottom chase 220 are being compressed. This unbalanced mold flow may cause damage to the internal components of the semiconductor device strip, such as bonding wire connections (e.g., in area 310).

Figure 3B:
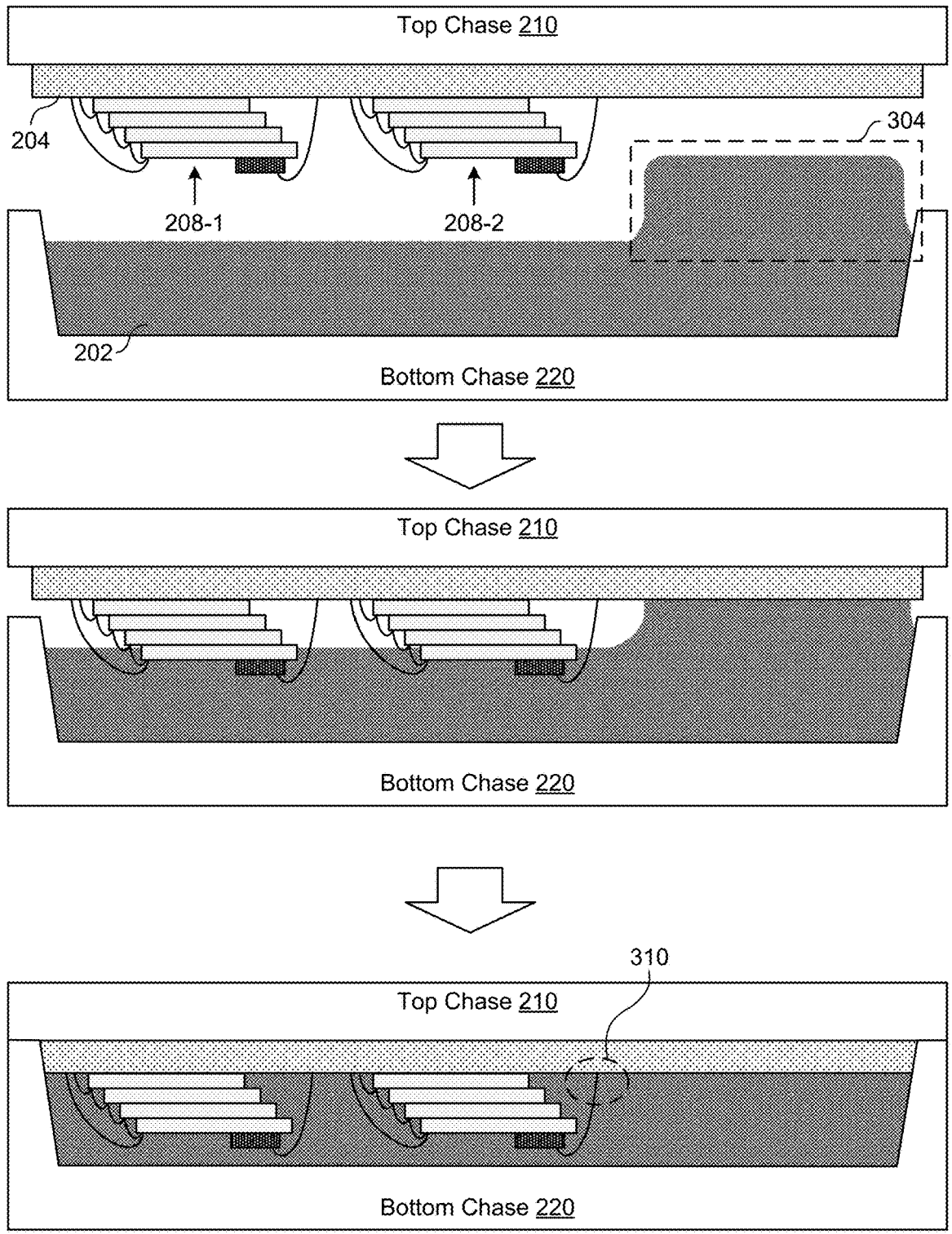

FIG. 3B is a cross-sectional side views of a series of operations for encapsulating a partially populated semiconductor device strip in accordance with some implementations. The example semiconductor strip (as described with reference to FIG. 3A) includes a single substrate 204 with three positions configured for coupling to three die stacks 208, with one position not populated with a die stack for one or more of the reasons discussed above, such as designation as an X-out, no-die, insufficient dies, and so forth.

Rather than using a uniform molding compound dispensing process as described with reference to FIG. 3A, the process shown in FIG. 3B uses a non-uniform molding compound dispensing process, causing more molding compound to be dispensed in areas of the release film in bottom chase 220 that correspond to non-populated areas (or areas having increased vertical displacement as described above). Specifically, additional molding compound 202 is applied in area 304, which corresponds to the non-populated position of the semiconductor device strip.

When the top chase 210 and bottom chase 220 of the compression molding device compress the molding compound into the semiconductor device strip, the additional molding compound in area 304 prevents unbalanced mold flow that would have otherwise occurred (depicted in FIG. 3A). In other words, the additional molding compound in area 304 counteracts forces applied to the molding compound by die stacks 208-1 and 208-2 while the molding compound and the semiconductor device strip are being compressed, thereby canceling (or reducing) unbalanced mold flow that would have otherwise occurred without the additional molding compound in area 304. As a result of the decreased (or lack of) unbalanced mold flow, internal components, such as bonding wire connections (e.g., in area 310) are protected from damage during the encapsulation operation.

FIGS. 4-9 demonstrate example molding compound dispensing operations for encapsulating a semiconductor device strip having 32 units (also referred to as segments or positions), with each unit corresponding to a device 100. In these examples, each unit is 2 cm in the x-direction, 3 cm in the y-direction, has a 0.1 cm mold cap (the height of the molding compound in the z-direction), and a molding compound density of 2 g/cm$^3$. Units that are populated with a die stack have a molding compound volume of 0.3 cm$^3$, and units that are not populated with a die stack (e.g., X-outs) have a molding compound volume of 0.6 cm$^3$. Therefore, 0.6 g of molding compound are required to fill units that are populated with a die stack (2 g/cm$^3$ compound density*0.3 cm$^3$ volume per unit=0.6 g of molding compound), and 1.2 g of molding compound are required to fill units that are not populated with a die stack (2 g/cm$^3$ compound density*0.6 cm$^3$ volume per unit=1.2 g of molding compound).

Figure 4:
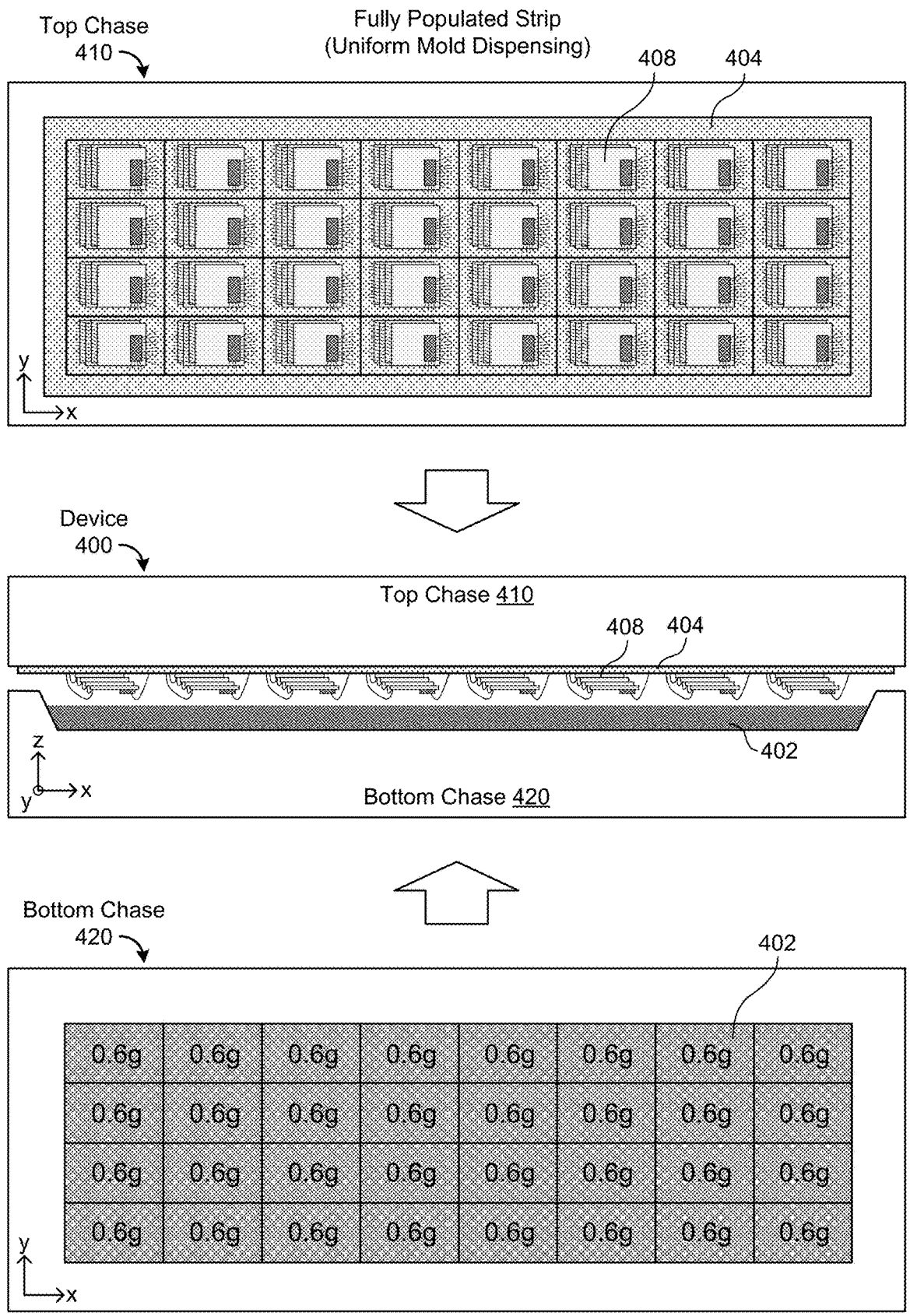
FIG. 4 includes a top view, a cross-sectional side view, and a bottom view of a compression molding device configured to encapsulate a fully populated semiconductor device strip using a uniform molding process.

FIG. 4 includes a top view, a cross-sectional side view, and a bottom view of a compression molding device 400 configured to encapsulate a semiconductor device strip. The semiconductor device strip is mounted to a top chase 410, and molding compound 402 is dispensed onto a release film, which is placed on a bottom chase 420. The semiconductor device strip in FIG. 4 includes a substrate 404 that is fully populated with a die stack 408 in each position. As such, all 32 units of the semiconductor device strip in FIG. 4 include a die stack 408.

In order to encapsulate each unit of the semiconductor device strip in FIG. 4, a total of 19.2 g is required (32 units*0.6 g/unit=19.2 g). By applying 0.6 g of molding compound 402 to each unit of the semiconductor device strip, the entire semiconductor device strip may be encapsulated. As such, 19.2 g of molding compound 402 may be dispensed onto a release film, 0.6 g at a time, in areas of the release film that correspond to the units of the semiconductor device strip. The semiconductor device strip is mounted to top chase 410, the release film is placed on bottom chase 420, and the top chase 410 and bottom chase 420 compress the molding compound 402 onto the semiconductor device strip, thereby encapsulating the semiconductor device strip in a compression operation.

Dispensing the molding compound as shown in FIG. 4 may be adequate for semiconductor device strips that are uniformly populated, but if any of the positions on the semiconductor device strip are not populated (or have different vertical displacements), uniformly dispensing the same amount of molding compound into each position of the release film (e.g., 0.6 g per unit) may cause unbalanced mold flow during the compression operation.

Figure 5A:
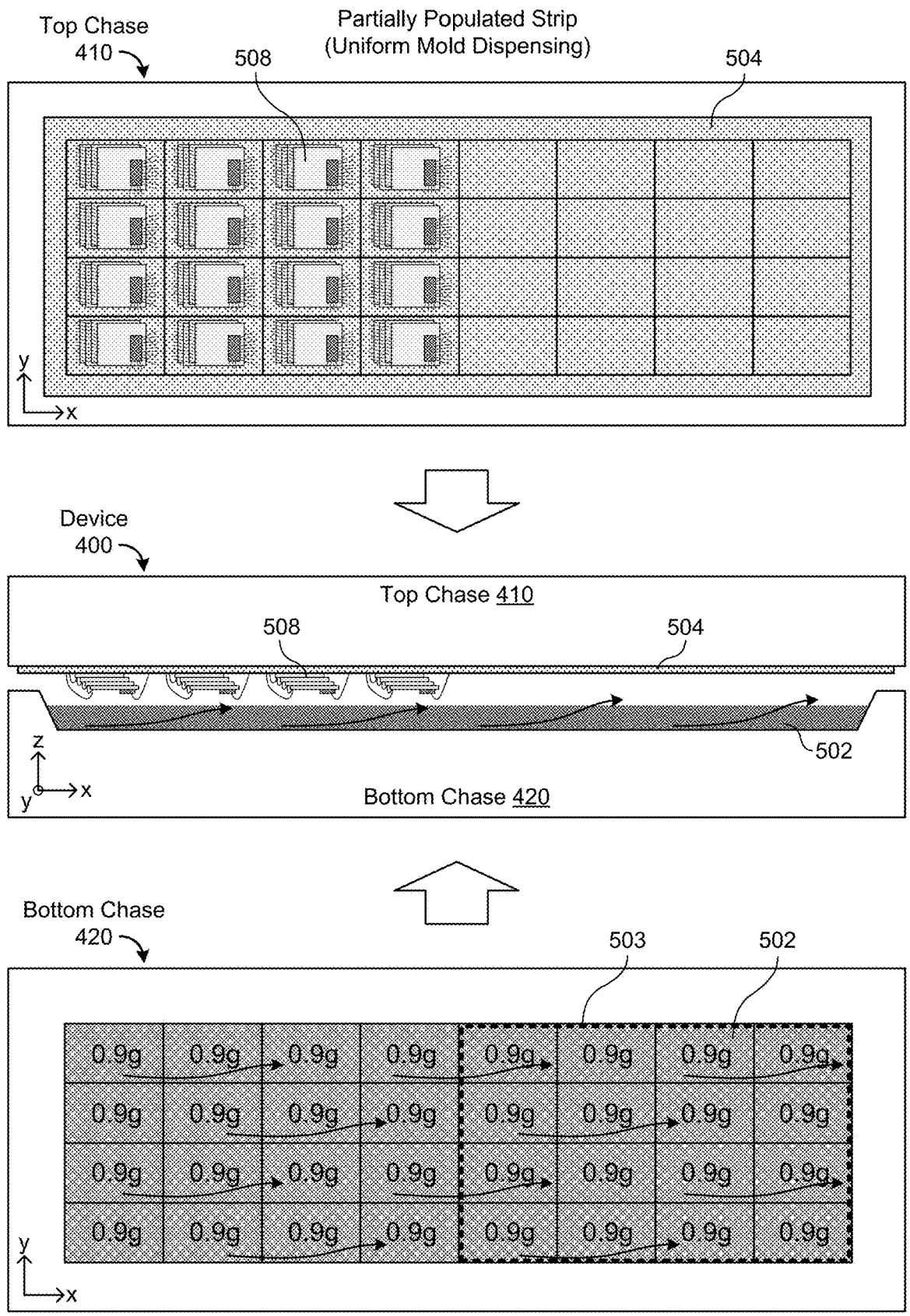
FIGS. 5A-5B include respective top views, cross-sectional side views, and bottom views of a compression molding device configured to encapsulate a partially populated semiconductor device strip using a uniform molding process and a non-uniform molding process, respectively.

FIG. 5A includes a top view, cross-sectional side view, and bottom view of a compression molding device 400 configured to encapsulate a semiconductor device strip. The semiconductor device strip in this example is partially populated, with half of the strip having no die stacks mounted to the substrate 504, and the other half of the strip having die stacks 508 mounted to the substrate 504.

The amount of molding compound 502 required to encapsulate the semiconductor device strip is 28.8 g, including a total of 9.6 g for the 16 units populated with a die stack (16 units*0.6 g/unit=9.6 g) and 19.2 g for the 16 units not populated with a die stack (16 units*1.2 g/unit=19.2 g). In this example, the molding compound is uniformly dispensed in the bottom chase 420. Therefore, 0.9 g is dispensed in each area of the release film corresponding to a unit of the semiconductor device strip (28.8 g/32 units=0.9 g/unit).

As shown in FIG. 5A, dispensing a uniform amount of molding compound across the release film located on the bottom chase leads to unbalanced mold flow during the compression operation. The molding compound flows from areas of the semiconductor device strip having a high vertical displacement (units including a die stack 508) to areas of the semiconductor device strip having low vertical displacement (units not populated with a die stack). As such, molding compound flowing into area 503 of the bottom chase 420 may cause damage to components (e.g., bonding wires) of the semiconductor device strip. In order to minimize this damage-inducing mold flow, molding compound 502 may be injected in a non-uniform manner as described with reference to FIG. 5B below.

Figure 5B:
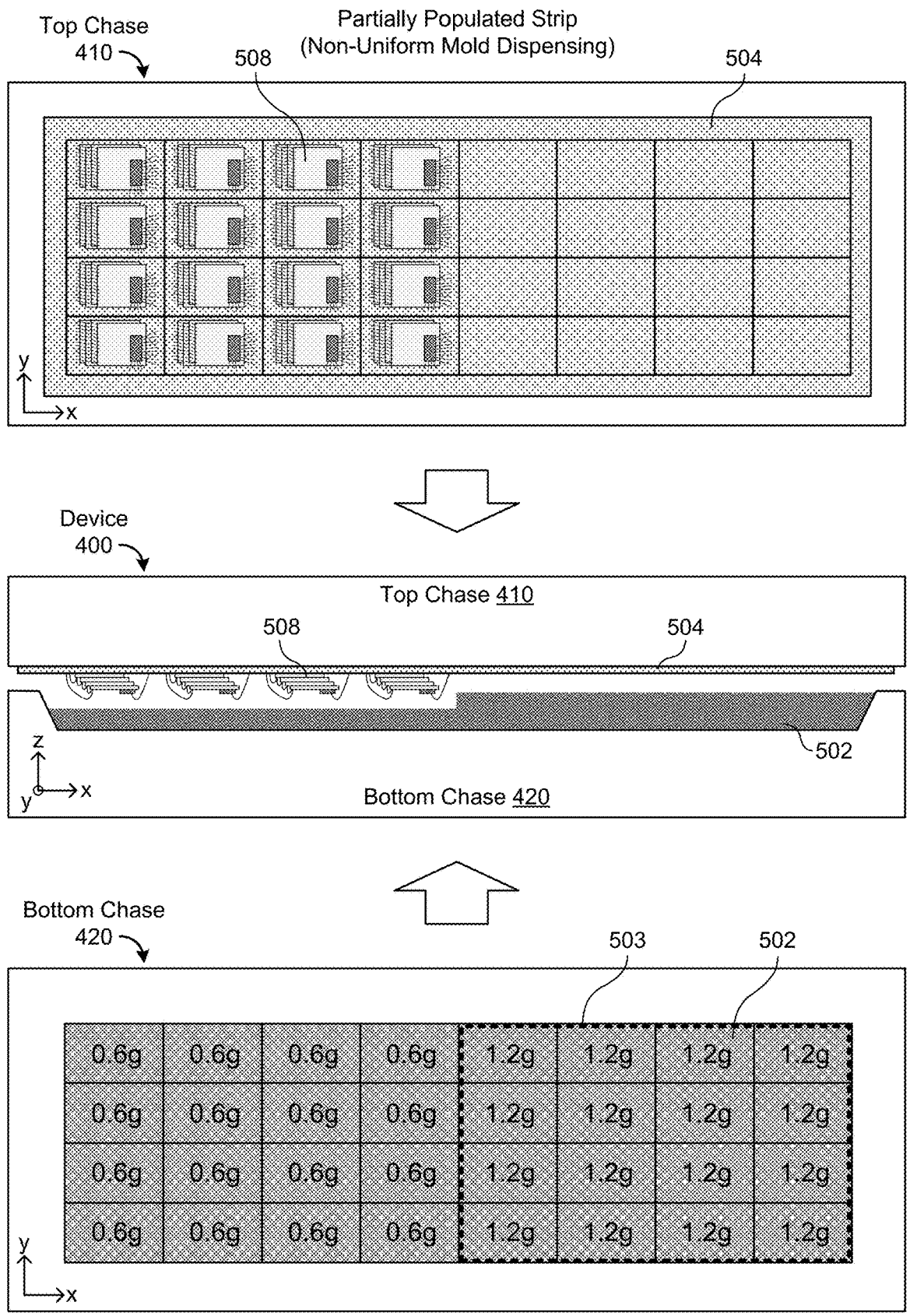

FIG. 5B includes a top view, cross-sectional side view, and bottom view of a compression molding device 400 configured to encapsulate a semiconductor device strip. The semiconductor device strip in this example is partially populated as described above with reference to FIG. 5A (with half of the strip having no die stacks mounted to the substrate 504, and the other half of the strip having die stacks 508 mounted to the substrate 504).

As discussed above, the amount of molding compound 502 required to encapsulate the semiconductor device strip is 28.8 g, including a total of 9.6 g for the 16 units populated with a die stack (16 units*0.6 g/unit=9.6 g) and 19.2 g for the 16 units not populated with a die stack (16 units*1.2 g/unit=19.2 g). In this example, the molding compound is not uniformly dispensed in the bottom chase 420. Instead, only 0.6 g of molding compound are dispensed in each area of the release film that corresponds to a populated unit of the semiconductor device strip, and 1.2 g of molding compound are dispensed in each area of the release film that corresponds to a non-populated unit of the semiconductor device strip.

As shown in FIG. 5B, dispensing a non-uniform amount of molding compound across the release film located on the bottom chase prevents unbalanced mold flow during the compression operation. The molding compound does not flow from areas of the semiconductor device strip having a high vertical displacement (units including a die stack 508) to areas of the semiconductor device strip having low vertical displacement (units not populated with a die stack), because the extra molding compound in the latter areas counteracts the forces caused by die stacks being compressed into the molding compound. As such, mold flow into area 503 is reduced or even prevented, thereby minimizing or preventing damage to components (e.g., bonding wires) of the semiconductor device strip.

Figure 6A:
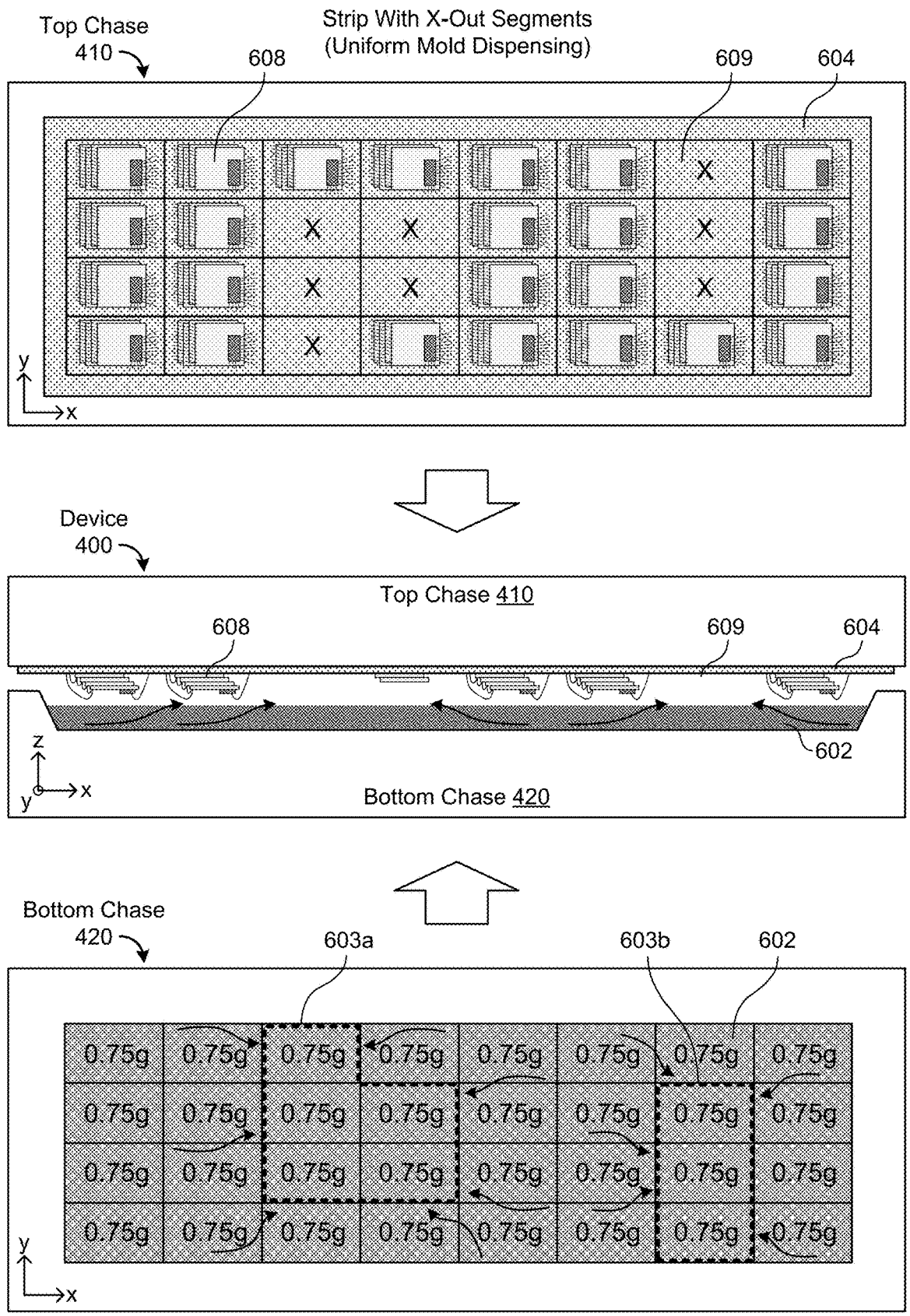
FIGS. 6A-6B include respective top views, cross-sectional side views, and bottom views of a compression molding device configured to encapsulate a semiconductor device strip with X-out segments using a uniform molding process and a non-uniform molding process, respectively.

FIG. 6A includes a top view, cross-sectional side view, and bottom view of a compression molding device 400 configured to encapsulate a semiconductor device strip. The semiconductor device strip in this example is partially populated, with some units (e.g., 609) of the strip being designated as X-out segments, thus having no die stacks 608 mounted to the substrate 604.

The amount of molding compound 602 required to encapsulate the semiconductor device strip is 24 g, including a total of 14.4 g for the 24 units populated with a die stack (24 units*0.6 g/unit=14.4 g) and 9.6 g for the 8 units not populated with a die stack (8 units*1.2 g/unit=9.6 g). In this example, the molding compound is uniformly dispensed in the bottom chase 420. Therefore, 0.75 g is dispensed in each area of the release film corresponding to a unit of the semiconductor device strip (24 g/32 units=0.75 g/unit).

As shown in FIG. 6A, dispensing a uniform amount of molding compound across the release film located on the bottom chase leads to unbalanced mold flow during the compression operation. The molding compound flows from areas of the semiconductor device strip having a high vertical displacement (units including a die stack 608) to areas of the semiconductor device strip having low vertical displacement (units not populated with a die stack, such as unit 609). As such, molding compound flowing into areas 603a and 603b of the bottom chase 420 may cause damage to components (e.g., bonding wires) of the semiconductor device strip. In order to minimize this damage-inducing mold flow, molding compound 602 may be injected in a non-uniform manner as described with reference to FIG. 6B below.

Figure 6B:
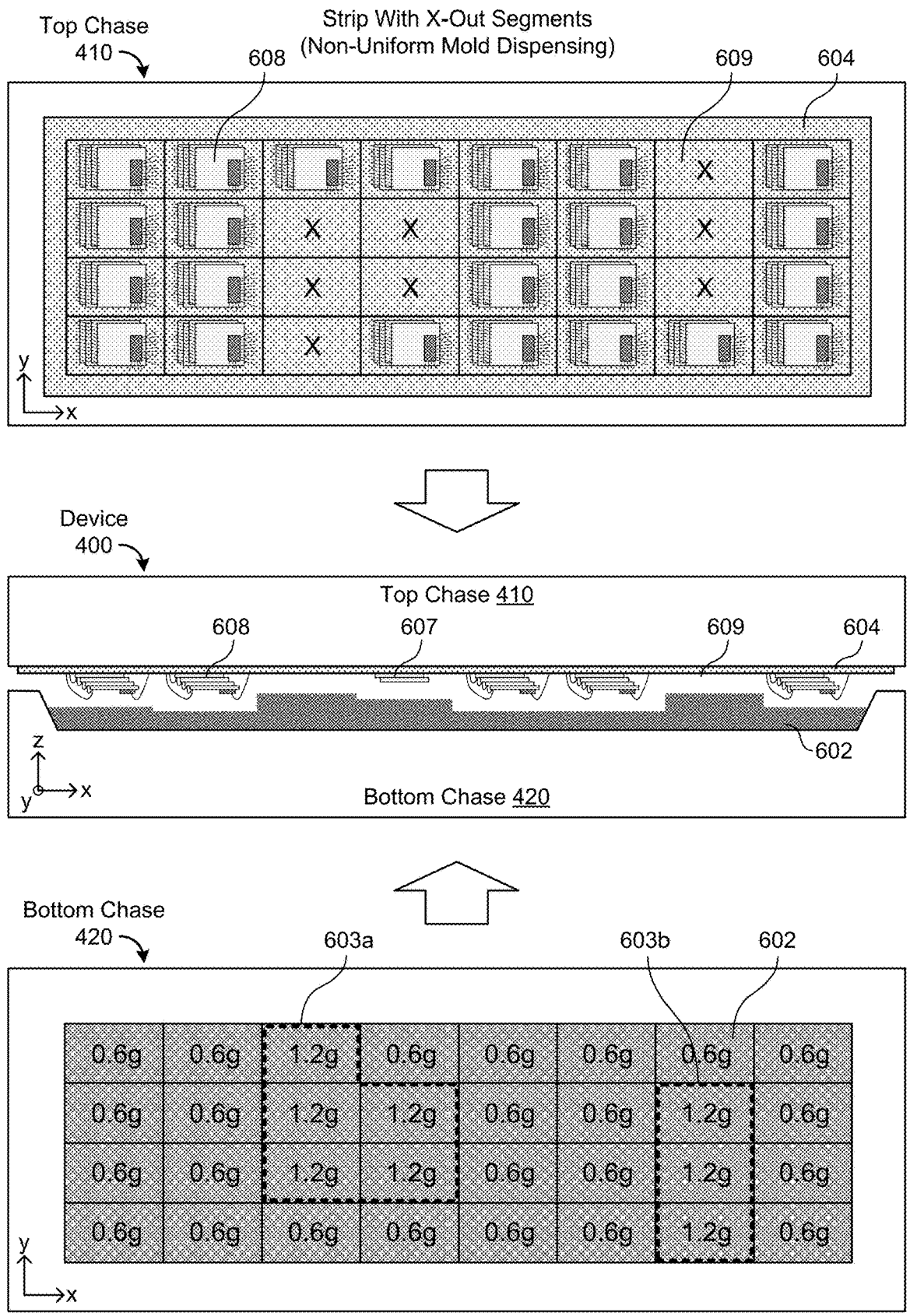

FIG. 6B includes a top view, cross-sectional side view, and bottom view of a compression molding device 400 configured to encapsulate a semiconductor device strip. The semiconductor device strip in this example is partially populated as described above with reference to FIG. 6A (with portions of the strip being designated as X-out segments).

As discussed above, the amount of molding compound 602 required to encapsulate the semiconductor device strip is 28.8 g, including a total of 9.6 g for the 16 units populated with a die stack (16 units*0.6 g/unit=9.6 g) and 19.2 g for the 16 units not populated with a die stack (16 units*1.2 g/unit=19.2 g). In this example, the molding compound is not uniformly dispensed in the bottom chase 420. Instead, only 0.6 g of molding compound are dispensed in each area of the release film that corresponds to a populated unit of the semiconductor device strip, and 1.2 g of molding compound are dispensed in each area of the release film that corresponds to a non-populated unit of the semiconductor device strip.

As shown in FIG. 6B, dispensing a non-uniform amount of molding compound across the release film located on the bottom chase prevents unbalanced mold flow during the compression operation. The molding compound does not flow from areas of the semiconductor device strip having a high vertical displacement (units including a die stack 608) to areas of the semiconductor device strip having low vertical displacement (units not populated with a die stack), because the extra molding compound in the latter areas counteracts the forces caused by die stacks being compressed into the molding compound. As such, mold flow into areas 603a and 603b is reduced or even prevented, thereby minimizing or preventing damage to components (e.g., bonding wires) of the semiconductor device strip.

Figure 7:
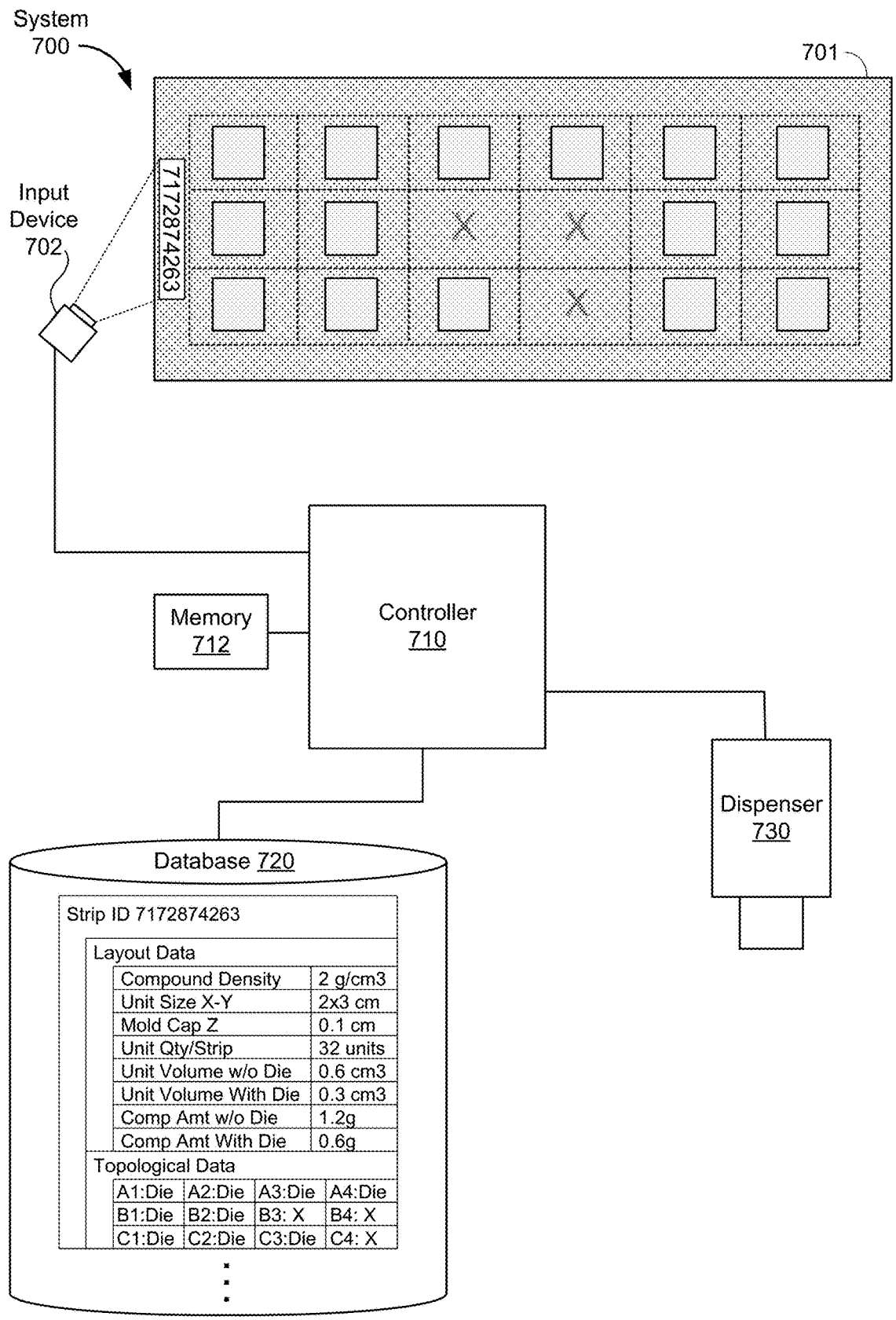
FIG. 7 is a block diagram of a molding compound dispensing system in accordance with some implementations.

FIG. 7 is a block diagram of a molding compound dispensing system 700 in accordance with some implementations. System 700 includes an input device 702, a controller 710, a memory 712, a pre-run database 720, and a dispenser 730. Input device 702, memory 712, database 720, and dispenser 730 are each communicatively coupled to controller 710. In some implementations, any of the input device 702, memory 712, database 720, and dispenser 730 may be combined with controller 710.

Input device 702 may be any device configured to obtain an identification (ID) code on a semiconductor device strip 701 (referred to herein as a strip ID). For example, input device 702 may be a scanner configured to scan a strip ID on the semiconductor device strip 701 and transmit the strip ID to controller 710. In some implementations, the strip ID may be a two-dimensional (2D) code including a number, a barcode, a quick response (QR) code, or any other feature that can be used to identify the semiconductor device strip 701. In some implementations, the input device 702 may be any other input device capable of accepting user inputs and transmitting those inputs to controller 710, such as a keyboard, mouse, key pad, touch-sensitive display, and so forth. For example, a keyboard may be used to input a strip ID corresponding to a particular semiconductor device strip 701.

Controller 710 includes one or more processors, such as one or more central processing units (CPUs) or any other electronic circuitry configured to execute instructions comprising a computer program (e.g., programs stored in memory 712). In some implementations, controller 710 is a programmable logic controller (PLC).

Memory 712 includes a non-transitory computer readable storage medium, such as volatile memory (e.g., one or more random access memory devices) and/or non-volatile memory (e.g., one or more flash memory devices, magnetic disk storage devices, optical disk storage devices, or other non-volatile solid state storage devices). Memory 712 may include one or more storage devices remotely located from controller 710. Memory 712 stores programs (described herein as modules and corresponding to sets of instructions) that, when executed by controller 710, cause controller 710 to perform functions as described herein. The modules and data described herein need not be implemented as separate programs, procedures, modules, or data structures. Thus, various subsets of these modules and data may be combined or otherwise rearranged in various implementations.

Database 720 includes a non-transitory computer readable storage medium, such as volatile and/or non-volatile memory, and stores data describing a plurality of substrates 701. Database 720 may be included in memory 712 or may be separate from memory 712. Database 720 is sometimes referred to as a pre-run database since it includes data obtained during previous manufacturing operations.

The data stored in database 720 may be indexed by the strip IDs corresponding to semiconductor device strips 701. The data includes, for each semiconductor device strip 701, (i) layout data describing the position and dimensions of each segment of the semiconductor device strip (including X-Y dimensions of each segment of the semiconductor device strip and mold cap dimensions in the Z-direction), and (ii) topological data describing whether each segment of the semiconductor device strip is populated with semiconductor die(s), is not populated (e.g., due to being designated as an X-out or a no-die segment), or is partially populated (compared to other populated segments). Additionally or alternatively, the topological data includes data indicative of any semiconductor components (not limited to die stacks) in each segment of the semiconductor device strip. The topological data may also be referred to as population data, as it describes what each segment is populated with (or whether each segment is populated at all). The topological data may include height data (e.g., how tall the die stacks are for each segment), die quantity, reject quantity, X-out quantity, no-die quantity, and so forth. By looking up a particular strip ID, controller 710 may obtain the layout data and topological data of the corresponding semiconductor device strip 701.

In some implementations, instead of using database 720 (or in addition to using database 720), controller 710 may obtain some or all of the layout data and/or topological data by using an automated optical inspection (AOI) machine by scanning or otherwise inspecting substrates 701 and discerning layout and/or topological features from the scans.

Dispenser 730 is a dispensing device configured to dispense molding compound (e.g., 202, 402, 502, and 602 described above with reference to FIGS. 2-6B) onto a release film associated with a compression molding device (e.g., 400 described above with reference to FIGS. 4-6B). Dispenser 730 is configured to dispense configurable amounts of molding compound in different areas of a release film that correspond to respective segments of the semiconductor device strip 701. The amounts of molding compound may be adjusted by a dispensing program that varies how long dispenser 730 is located over each area of the release film while dispensing the molding compound at a continuous dispensing rate. Alternatively, the dispensing program may vary a dispensing rate of dispenser 730 while the dispenser moves over each area of the release film at a constant rate.

Figure 8A:
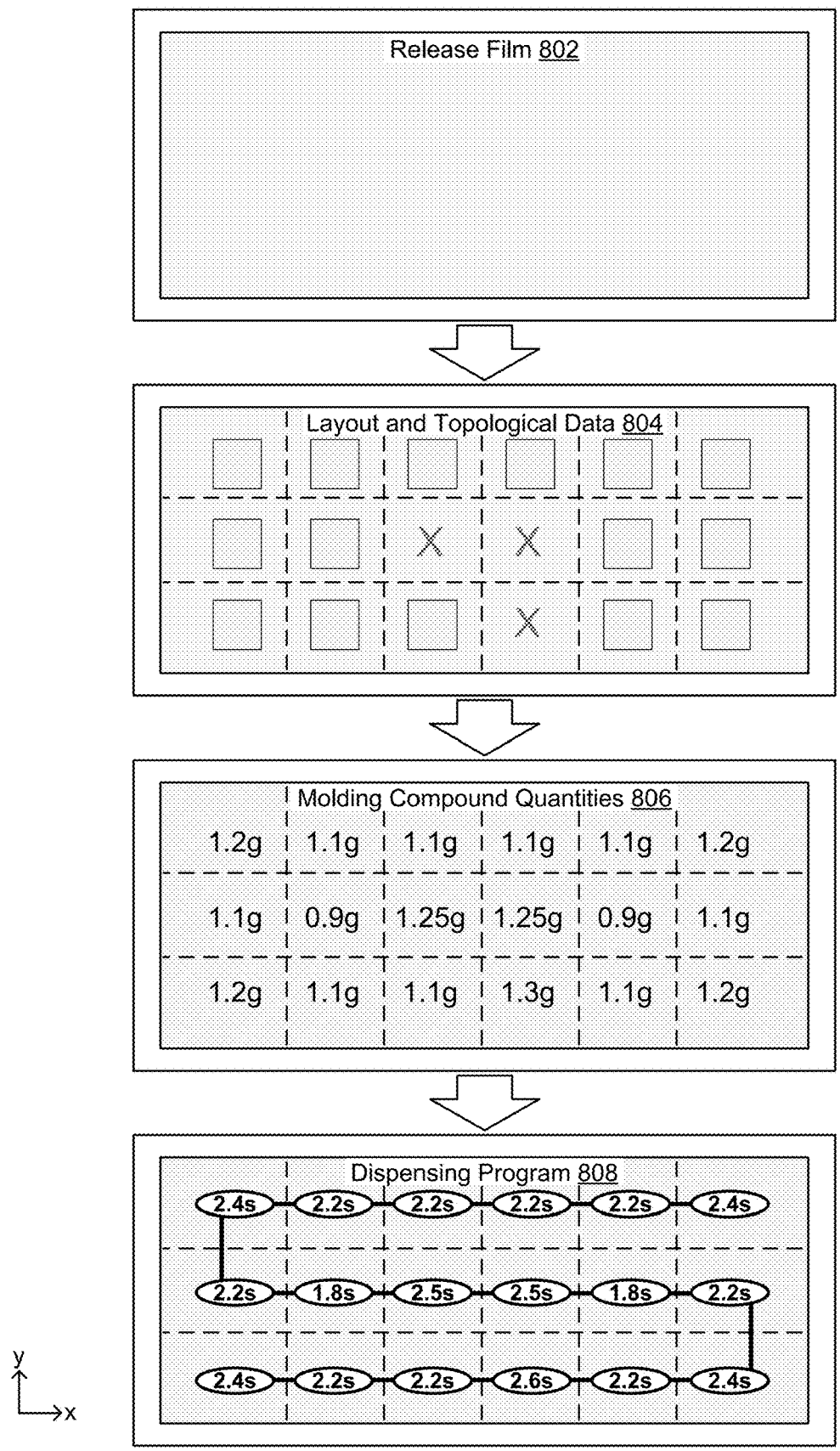
FIGS. 8A-8B depict a series of operations for controlling the molding compound dispensing system of FIG. 7 in accordance with some implementations.
Figure 8B:
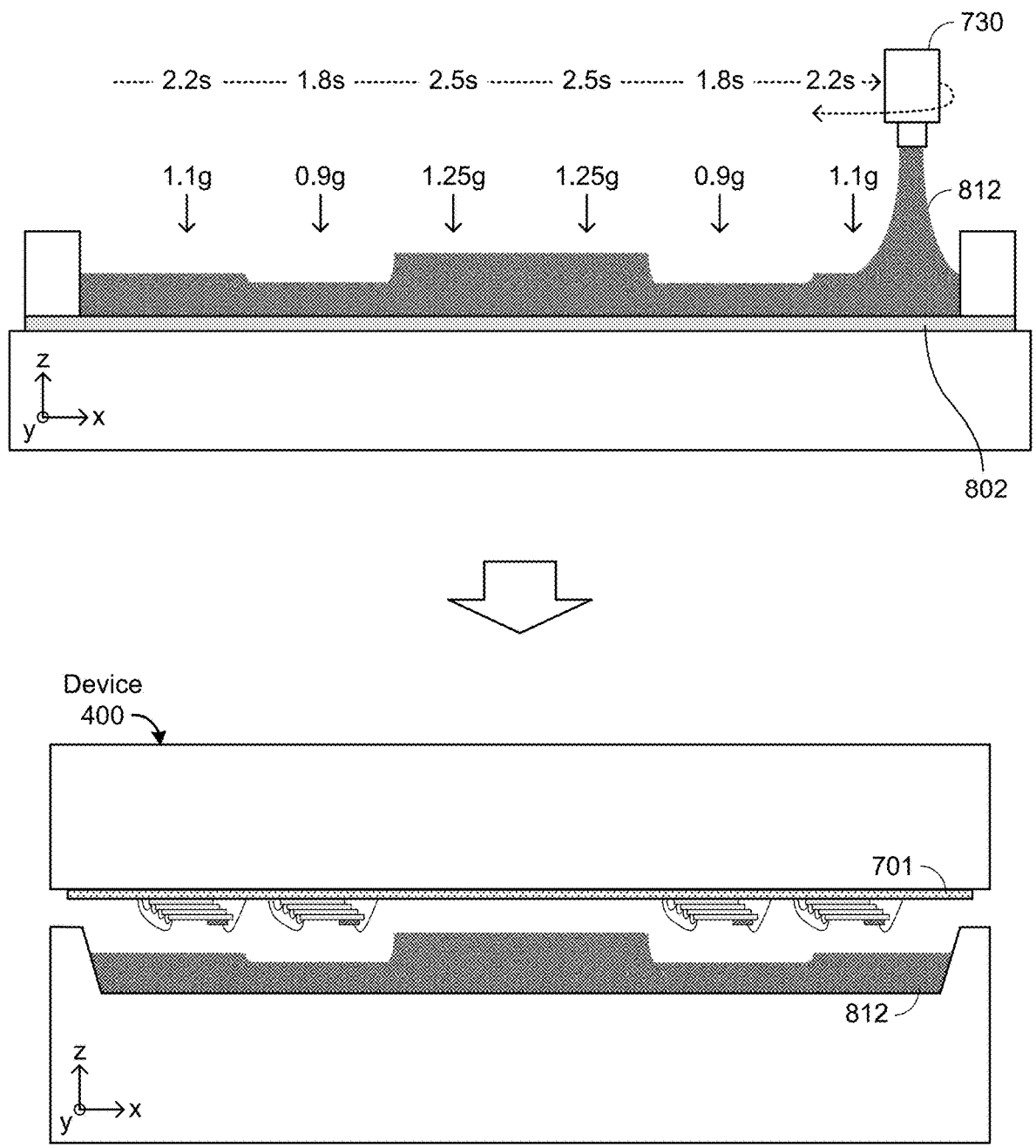

FIGS. 8A-8B depict a series of operations for controlling molding compound dispensing system 700 (described in FIG. 7) to dispense adjustable amounts of molding compound on a release film in accordance with some implementations.

Referring to FIG. 8A, a blank release film 802 provides a surface upon which molding compound may be dispensed and transferred to the bottom chase of a compression molding device.

Layout and topological data 804 is depicted as being projected over the release film. The layout data specifies the quantity (e.g., 18 per strip), positions (e.g., row and column), measurements (e.g., 2×3 cm), and mold cap (e.g., 0.1 cm) of each segment of the semiconductor device strip. The topological data specifies whether each segment is populated (e.g., with a die stack), not populated (e.g., designated as an X-out or no-die segment), or partially populated (e.g., with an incomplete die stack).

Molding compound quantities 806 are determined based on the layout and topological data 804. Controller 710 uses the layout data to segment the release film 802 into a plurality of areas (each area corresponding to a segment of the semiconductor device strip) and the topological data to determine how much molding compound should be dispensed in each of the areas. Areas of the release film 802 corresponding to non-populated or partially populated segments of the semiconductor device strip are provided more molding compound (e.g., 1.25 g) than areas corresponding to fully populated segments of the semiconductor device strip (e.g., 0.9 g). In addition, areas of the release film 802 corresponding to corner and edge segments of the semiconductor device strip may be provided more molding compound (e.g., 1.2 g and 1.1 g, respectively) than areas corresponding to center segments of the semiconductor device strip (e.g., 0.9 g).

Dispensing program 808 provides instructions to dispenser 730, thereby controlling dispenser 730 to dispense the molding compound quantities 806 onto the release film 802. Dispensing program 808 may include dispensing durations corresponding to each area of the release film, with longer dispensing durations (e.g., 2.5 s) corresponding to more molding compound to be dispensed (e.g., 1.25 g) compared to shorter dispensing durations (e.g., 1.8 s) corresponding to less molding compound to be dispensed (e.g., 0.9 g). Alternatively, dispensing program 808 may include start and stop times for controlling dispenser 730 to start dispensing molding compound on a particular area of the release film at the start time and to stop dispensing molding compound onto the particular area of the release film at the stop time. Alternatively, dispensing program 808 may include instructions for varying dispensing rates for dispenser 730 as dispenser 730 moves around release film 802 at a constant rate (e.g., causing dispenser 730 to dispense at a higher rate for areas that require additional molding compound and at a lower rate for areas that require less molding compound). Alternatively, dispensing program 808 may include instructions for controlling movement of the release film 802 with respect to dispenser 730 in any of the manners described above (e.g., with the release film moving with respect to the dispenser, rather than the dispenser moving with respect to the release film). In some implementations, any of the aforementioned alternative dispensing program instructions may be combined (e.g., altering dispensing duration, dispensing rate, dispensing start/stop times, dispenser movements with respect to the release film, and/or release film movements with respect to the dispenser).

Referring to FIG. 8B, dispenser 730 dispenses the determined amounts of molding compound 812 onto release film 802 in accordance with the dispensing program 808. Release film 802 (with the dispensed molding compound 812) is then transferred to the bottom chase of compression molding device 400. With molding compound 812 disposed in the bottom chase of device 400 and semiconductor device strip 701 mounted to the top chase of device 400, device 400 compresses the top chase and bottom chase, thereby encapsulating semiconductor device strip 701 with molding compound 812 with little to no unbalanced mold flow.

Figure 9:
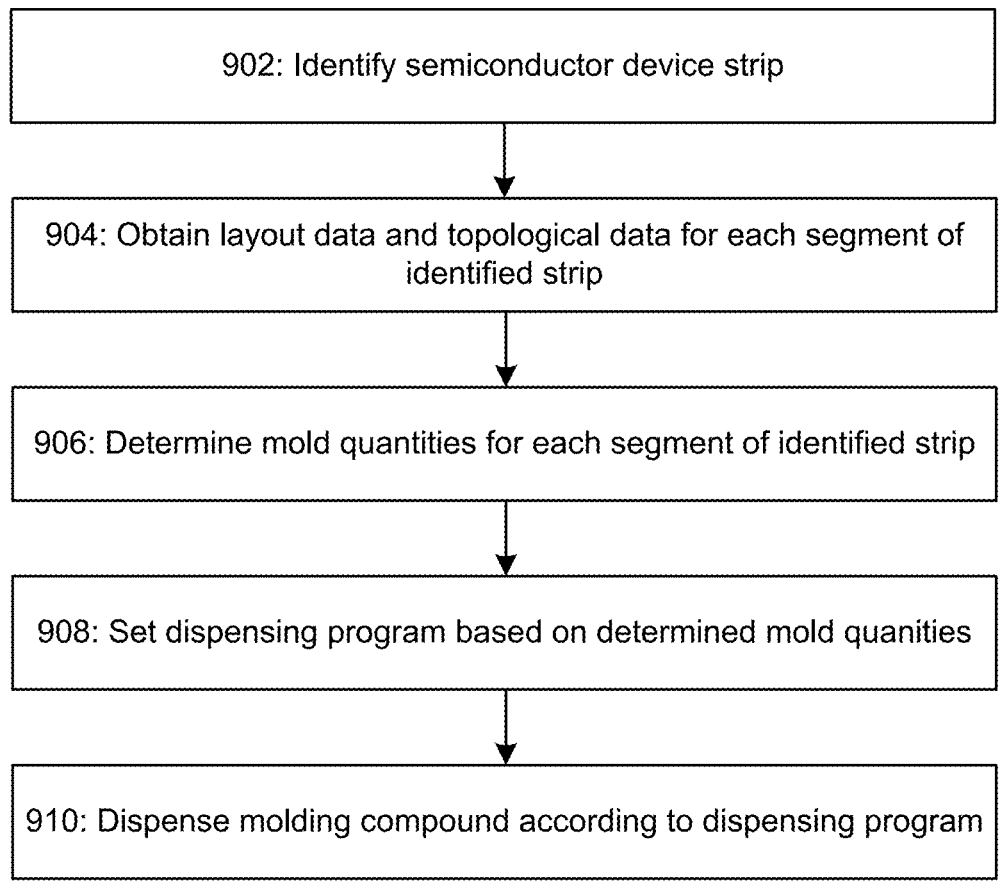
FIG. 9 is a flow diagram of a method of dispensing molding compound using the dispensing system of FIG. 7 and operations depicted in FIGS. 8A-8B in accordance with some implementations.

FIG. 9 is a flow diagram of a method 900 of dispensing molding compound using the dispensing system of FIG. 7 and operations depicted in FIGS. 8A-8B in accordance with some implementations. Method 900 may be governed by instructions that are stored in a computer memory or non-transitory computer readable storage medium (712, FIG. 7). The instructions may be included in one or more programs stored in the non-transitory computer readable storage medium. When executed by one or more processors (710, FIG. 7), the instructions cause the dispensing system to perform the method. The non-transitory computer readable storage medium may include one or more solid state storage devices (e.g., Flash memory), magnetic or optical disk storage devices, or other non-volatile memory devices. The instructions may include source code, assembly language code, object code, or any other instruction format that can be interpreted by one or more processors. Some operations in the process may be combined, and the order of some operations may be changed.

Controller 710 identifies (902), using input device 702, a semiconductor device strip 701 comprising a substrate having a plurality of segments allocated for die stacks (or any other combination of one or more semiconductor devices).

Controller 710 obtains (904), from database 720, layout and topological data 804 for each segment of the identified strip, wherein the layout data specifies the quantity, positions, measurements, and/or mold cap of each segment of the semiconductor device strip, and the topological data specifies whether each segment is populated, not populated, or partially populated. In some implementations, layout and/or topological data 804 includes height data for each segment of the identified strip, specifying the stack height for each segment. In some implementations, controller 710 also obtains, from database 720, an area specification indicating a 2D surface area of the identified semiconductor device strip and a mold cap specification indicating a required molding height of the identified semiconductor device strip.

Controller 710 determines (906) mold quantities (amounts of molding compound to dispense) for each segment of the identified strip. Controller 710 determines the mold quantities based on the layout and topological data, providing more molding compound to segments that are not populated (or partially populated) compared to fully populated segments, providing more molding compound to segments that are corner or edge segments compared to center segments, and/or providing more molding compound to segments have lower stack heights compared to segments having higher stack heights. The mold quantities may further be determined based on area and mold cap specifications for the semiconductor device strip.

Controller 710 sets (908) a dispensing program based on determined mold quantities. Controller 710 may determine a dispensing duration for each of the plurality of segments of the release film, wherein dispensing durations are positively correlated to amounts of molding compound to be dispensed (e.g., higher durations correspond to additional amounts of molding compound to be dispensed). Alternatively, controller 710 may determine a dispenser movement speed for each of the plurality of segments of the release film, wherein dispenser movement speeds are negatively correlated to amounts of molding compound to be dispensed (e.g., higher dispenser movement speeds correspond to less amounts of molding compound to be dispensed). Alternatively, controller 710 may determine a dispensing rate for each of the plurality of segments of the release film, wherein dispensing rates are positively correlated to amounts of molding compound to be dispensed (e.g., higher dispensing rates correspond to additional amounts of molding compound to be dispensed).

Controller 710 causes dispenser 730 to dispense (910) the determined amounts of molding compound onto the plurality of segments of the release film according to the dispensing program, wherein each of the plurality of segments of the release film corresponds to one of the plurality of segments of the substrate.

A stacked die semiconductor device assembled according to method 900 includes bond wires and other components that are free from deformations that would normally be caused by mold flow. For example, a stacked die semiconductor device not assembled according to method 900 and thereby subject to unbalanced mold flow during encapsulation is likely to have deformed or damaged bond wires (e.g., area 310, FIG. 3A), whereas a stacked die semiconductor device that is assembled according to method 900 is spared from most, if not all, unbalanced mold flow during encapsulation and thus includes bond wires that are free from deformations and damage (e.g., area 310, FIG. 3B). In addition, a stacked die semiconductor device assembled according to method 900 has reduced wire sweeps and voids. As such, the manufacturing process steps described above impart distinctive structural characteristics to the final product (e.g., bond wires free of deformations and damage, reduced wire sweeps, and/or reduced voids), thereby connoting structure even when described as part of a process of manufacture.

It will be appreciated by those skilled in the art that changes could be made to the exemplary embodiments shown and described above without departing from the broad inventive concepts thereof. It is understood, therefore, that this invention is not limited to the exemplary embodiments shown and described, but it is intended to cover modifications within the spirit and scope of the present invention as defined by the claims. For example, specific features of the exemplary embodiments may or may not be part of the claimed invention and various features of the disclosed embodiments may be combined. The words "right", "left", "lower" and "upper" designate directions in the drawings to which reference is made. The words "inwardly" and "outwardly" refer to directions toward and away from, respectively, the geometric center of the ball grid array having a multi-surface trace interface. Unless specifically set forth herein, the terms "a", "an" and "the" are not limited to one element but instead should be read as meaning "at least one".

It is to be understood that at least some of the figures and descriptions of the invention have been simplified to focus on elements that are relevant for a clear understanding of the invention, while eliminating, for purposes of clarity, other elements that those of ordinary skill in the art will appreciate may also comprise a portion of the invention. However, because such elements are well known in the art, and because they do not necessarily facilitate a better understanding of the invention, a description of such elements is not provided herein.

Further, to the extent that the methods of the present invention do not rely on the particular order of steps set forth herein, the particular order of the steps should not be construed as limitation on the claims. Any claims directed to the methods of the present invention should not be limited to the performance of their steps in the order written, and one skilled in the art can readily appreciate that the steps may be varied and still remain within the spirit and scope of the present invention.

What is claimed is:

1. A method of controlling a molding compound dispenser, comprising:
at a controller having one or more processors and memory storing instructions for execution by the one or more processors:
identifying, using an electronic input device communicatively coupled to the controller, a semiconductor device strip comprising a substrate having a plurality of segments allocated for die stacks;
obtaining topological data of the identified semiconductor device strip for each of the plurality of segments, wherein the topological data includes data indicative of any semiconductor components in each respective segment;
determining a mold cap of the identified semiconductor device strip;
determining an amount of molding compound to be applied to each of the plurality of segments based on the topological data for each respective segment and the mold cap; and
causing a molding compound dispenser to dispense the determined amounts of molding compound at each of the respective segments.

2. The method of claim 1, further comprising:
obtaining layout data of the identified semiconductor device strip, wherein the layout data indicates whether each of the plurality of segments includes an edge of the substrate or does not include an edge of the substrate;
wherein determining the amount of molding compound to be applied to each of the plurality of segments is further based on the layout data, wherein an amount of molding compound to be applied to a segment on an edge or corner of the substrate is greater than an amount of molding compound to be applied to a segment that is not on an edge or corner of the substrate.

3. The method of claim 1, further comprising:
obtaining height data of the identified semiconductor device strip, wherein the height data indicates a stack height for each segment that is populated with a die stack;
wherein determining the amount of molding compound to be applied to each of the plurality of segments is further based on the height data, wherein an amount of molding compound to be applied to a segment having a first stack height is greater than an amount of molding compound to be applied to a segment having a second stack height greater than the first stack height.

4. The method of claim 1, further comprising:
determining a two-dimensional surface area of the identified semiconductor device strip;
wherein determining the amount of molding compound to be applied to each of the plurality of segments is further based on the two-dimensional surface area.

5. The method of claim 1, wherein:
causing the molding compound dispenser to dispense the determined amounts of molding compound at each of the respective segments includes causing the molding compound dispenser to dispense the determined amounts of molding compound on a plurality of segments of a release film, wherein each of the plurality of segments of the release film corresponds to one of the plurality of segments of the substrate; and
the method further comprises operating a compression molding device to apply the dispensed amounts of molding compound to corresponding segments of the plurality of segments of the substrate.

6. The method of claim 5, wherein operating the compression molding device comprises:
transferring the release film including the dispensed amounts of molding compound to a bottom chase of a compression molding device; and
mounting the semiconductor device strip including the plurality of segments of the substrate to a top chase of the compression molding device;
wherein applying the dispensed amounts of molding compound to the corresponding segments of the plurality of segments of the substrate includes compressing the bottom chase and the top chase of the compression molding device.

7. The method of claim 1, wherein causing the molding compound dispenser to dispense the determined amounts of molding compound at each of the respective segments comprises:
determining a dispensing duration for each of the plurality of segments, wherein dispensing durations are positively correlated to amounts of molding compound to be dispensed; and
instructing the molding compound dispenser to dispense molding compound at each of the plurality of segments in accordance with corresponding dispensing durations.

8. The method of claim 1, wherein causing the molding compound dispenser to dispense the determined amounts of molding compound at each of the plurality of segments comprises:
determining a dispensing speed for each of the plurality of segments, wherein dispensing speeds are negatively correlated to amounts of molding compound to be dispensed; and
instructing the molding compound dispenser to dispense molding compound at each of the plurality of segments in accordance with corresponding dispensing speeds.

9. The method of claim 1, wherein:
the topological data indicates whether each of the plurality of segments is populated with a die stack or is not populated with a die stack; and
an amount of molding compound to be applied to a segment that is not populated with a die stack is greater than an amount of molding compound to be applied to a segment that is populated with a die stack.

10. The method of claim 1, wherein obtaining the topological data includes searching a database storing topological data of a plurality of semiconductor device strips.

11. A stacked die semiconductor device assembled according to the method of claim 1.

12. A molding compound dispensing system including one or more processors and memory storing one or more programs to be executed by the one or more processors, the one or more programs including instructions for:
identifying, using an electronic input device communicatively coupled to the controller, a semiconductor device strip comprising a substrate having a plurality of segments allocated for die stacks;
obtaining topological data of the identified semiconductor device strip for each of the plurality of segments, wherein the topological data includes data indicative of any semiconductor components in each respective segment;
determining a mold cap of the identified semiconductor device strip;

determining an amount of molding compound to be applied to each of the plurality of segments based on the topological data for each respective segment and the mold cap; and causing a molding compound dispenser to dispense the determined amounts of molding compound at each of the respective segments.

13. The molding compound dispensing system of claim 12, wherein the one or more programs further include instructions for:

obtaining layout data of the identified semiconductor device strip, wherein the layout data indicates whether each of the plurality of segments includes an edge of the substrate or does not include an edge of the substrate;

wherein determining the amount of molding compound to be applied to each of the plurality of segments is further based on the layout data, wherein an amount of molding compound to be applied to a segment on an edge or corner of the substrate is greater than an amount of molding compound to be applied to a segment that is not on an edge or corner of the substrate.

14. The molding compound dispensing system of claim 12, wherein the one or more programs further include instructions for:

obtaining height data of the identified semiconductor device strip, wherein the height data indicates a stack height for each segment that is populated with a die stack;

wherein determining the amount of molding compound to be applied to each of the plurality of segments is further based on the height data, wherein an amount of molding compound to be applied to a segment having a first stack height is greater than an amount of molding compound to be applied to a segment having a second stack height greater than the first stack height.

15. The molding compound dispensing system of claim 12, wherein the one or more programs further include instructions for:

determining a two-dimensional surface area of the identified semiconductor device strip;

wherein determining the amount of molding compound to be applied to each of the plurality of segments is further based on the two-dimensional surface area.

16. The molding compound dispensing system of claim 12, wherein:

the instructions for causing the molding compound dispenser to dispense the determined amounts of molding compound at each of the respective segments include instructions for causing the molding compound dispenser to dispense the determined amounts of molding compound on a plurality of segments of a release film, wherein each of the plurality of segments of the release film corresponds to one of the plurality of segments of the substrate; and the one or more programs further include instructions for operating a compression molding device to apply the dispensed amounts of molding compound to corresponding segments of the plurality of segments of the substrate.

17. The molding compound dispensing system of claim 16, wherein the instructions for operating the compression molding device comprise instructions for:

transferring the release film including the dispensed amounts of molding compound to a bottom chase of a compression molding device; and mounting the semiconductor device strip including the plurality of segments of the substrate to a top chase of the compression molding device;

wherein applying the dispensed amounts of molding compound to the corresponding segments of the plurality of segments of the substrate includes compressing the bottom chase and the top chase of the compression molding device.

18. The molding compound dispensing system of claim 16, wherein the instructions for causing the molding compound dispenser to dispense the determined amounts of molding compound on the plurality of segments of the release film comprise instructions for:

determining a dispensing duration for each of the plurality of segments, wherein dispensing durations are positively correlated to amounts of molding compound to be dispensed; and instructing the molding compound dispenser to dispense molding compound at each of the plurality of segments in accordance with corresponding dispensing durations.

19. The molding compound dispensing system of claim 16, wherein the instructions for causing the molding compound dispenser to dispense the determined amounts of molding compound on the plurality of segments of the release film comprise instructions for:

determining a dispensing speed for each of the plurality of segments, wherein dispensing speeds are negatively correlated to amounts of molding compound to be dispensed; and instructing the molding compound dispenser to dispense molding compound at each of the plurality of segments in accordance with corresponding dispensing speeds.

20. The molding compound dispensing system of claim 12, wherein:

the topological data indicates whether each of the plurality of segments is populated with a die stack or is not populated with a die stack; and an amount of molding compound to be applied to a segment that is not populated with a die stack is greater than an amount of molding compound to be applied to a segment that is populated with a die stack.

* * * * *